(12) United States Patent
Markytan et al.

(10) Patent No.: US 8,523,404 B2
(45) Date of Patent: Sep. 3, 2013

(54) LED LIGHTING DEVICE WITH HOMOGENEOUS LIGHT INTENSITY AND REDUCED DAZZLE ACTION

(75) Inventors: Ales Markytan, Regensburg (DE); Christoph Neureuther, Hong Kong (HK); Steffen Block, Lich (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/133,151

(22) PCT Filed: Nov. 27, 2009

(86) PCT No.: PCT/EP2009/065978
§ 371 (c)(1),
(2), (4) Date: Dec. 5, 2011

(87) PCT Pub. No.: WO2010/076103
PCT Pub. Date: Jul. 8, 2010

(65) Prior Publication Data
US 2012/0087133 A1  Apr. 12, 2012

(30) Foreign Application Priority Data
Dec. 8, 2008 (DE) .......................... 10 2008 061 032

(51) Int. Cl.
*F21V 7/00* (2006.01)
(52) U.S. Cl.
USPC .......................... 362/308; 362/334; 362/341
(58) Field of Classification Search
USPC .......................... 362/308, 334, 341
See application file for complete search history.

(56) References Cited

U.S. PATENT DOCUMENTS

| | | | |
|---|---|---|---|
| 6,758,582 B1 | 7/2004 | Hsiao et al. | |
| 7,246,931 B2 | 7/2007 | Hsieh | |
| 7,794,121 B2 | 9/2010 | Melzner | |
| 2002/0101734 A1* | 8/2002 | Tokida et al. | ................. 362/245 |
| 2004/0057244 A1 | 3/2004 | Amano | |
| 2004/0201987 A1 | 10/2004 | Omata | |
| 2004/0207999 A1 | 10/2004 | Suehiro | |
| 2004/0223339 A1 | 11/2004 | Tsuei et al. | |
| 2007/0164303 A1 | 7/2007 | Ho | |
| 2007/0247842 A1 | 10/2007 | Zampini et al. | |

FOREIGN PATENT DOCUMENTS

| | | |
|---|---|---|
| CN | 1538538 | 10/2004 |
| DE | 38 03 951 | 8/1989 |
| DE | 20 2005 018 155 | 5/2006 |
| DE | 10 2005 059 541 | 6/2006 |
| DE | 20 2006 002 797 | 6/2006 |
| DE | 10 2005 059 198 | 6/2007 |
| DE | 20 2007 006 815 | 8/2007 |
| EP | 1 182 395 | 2/2002 |
| EP | 1 255 306 | 4/2002 |
| EP | 1 376 708 | 1/2004 |
| WO | WO 2006/092697 | 9/2006 |
| WO | WO 2008/002362 | 1/2008 |

* cited by examiner

*Primary Examiner* — Mary Ellen Bowman
(74) *Attorney, Agent, or Firm* — Cozen O'Connor

(57) ABSTRACT

An illumination device, comprising a basic body (1) having a cutout (5), a reflector (51), which is formed at least by parts of the cutout (5), and at least one optoelectronic semiconductor component (20) arranged in the cutout (5), wherein the semiconductor component (20) has an optical element (3) designed for directing at least part of the electromagnetic radiation emitted by the semiconductor component (20) during operation onto the reflector (51), wherein a radiation exit area (61) of the illumination device is at least twice as large as the sum of the radiation exit areas (44) of the semiconductor components.

9 Claims, 3 Drawing Sheets

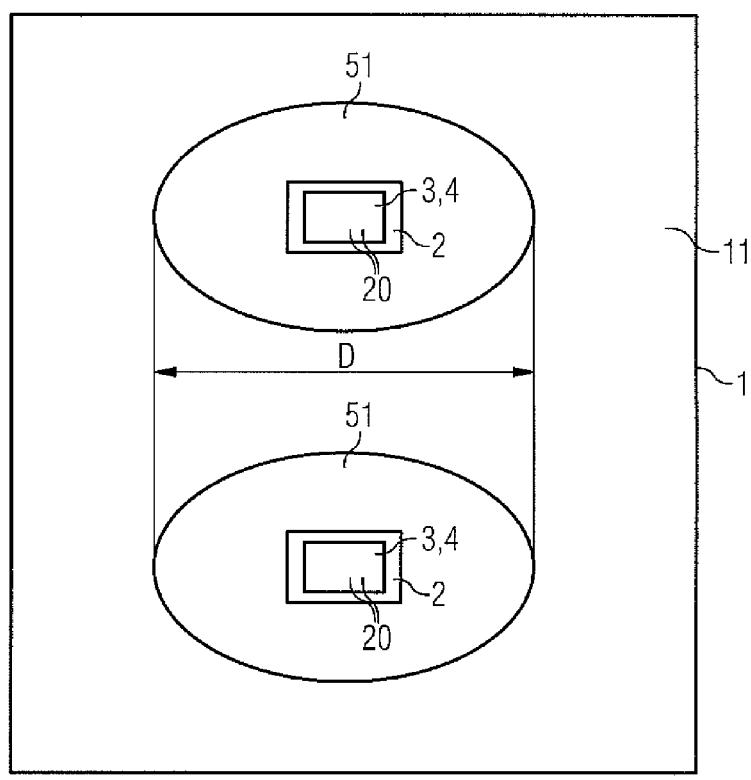

LED LIGHTING DEVICE WITH HOMOGENEOUS LIGHT INTENSITY AND REDUCED DAZZLE ACTION

RELATED APPLICATIONS

This application is a U.S. National Phase Application under 35 USC 371 of International Application No. PCT/EP2009/065978, filed on Nov. 27, 2009.

This patent application claims the priority of German patent application 10 2008 061 032.1 filed Dec. 8, 2008, the disclosure content of which is hereby incorporated by reference.

FIELD OF THE INVENTION

The invention is related to an LED lighting device and, more particularly, to such a device with homogenous light intensity and reduced dazzle action.

SUMMARY OF THE INVENTION

One object of the invention is to provide an illumination device which enables a uniform radiation emission distributed over the entire illumination device and the perception of brightness differences for an external observer of the illumination device is thus reduced. A further object is to provide an illumination device which reduces or avoids a glare effect for an external observer of the illumination device.

In accordance with at least one embodiment, the illumination device comprises a basic body having a cutout. The basic body can be formed with a thermosetting plastic material or thermoplastic material, a metal or else with a ceramic material, or consist of such. Preferably, the basic body is a solid body. Furthermore, the basic body comprises a cutout. The cutout is a depression in the basic body which has an opening and is freely accessible from outside. Furthermore, the cutout has for example a bottom area and at least one side area. At bottom and side areas, the cutout adjoins the basic body. The bottom area can be situated on that side of the cutout which lies opposite the opening. The opening and the bottom area are connected to one another by the side area.

In accordance with at least one embodiment, the illumination device comprises a reflector, which is formed at least by parts of the cutout. The cutout can form the reflector. This can be achieved by the basic body being embodied in reflective fashion in the cutout. For this purpose, the basic body itself can be formed with a reflective material at least at the location of the cutout. It is likewise possible for the cutout to be coated with a reflective material. By way of example, the coating can be a metal, for example aluminum.

In accordance with at least one embodiment, the illumination device has at least one optoelectronic semiconductor component arranged in the cutout. The semiconductor component is fitted, for example, on the bottom area of the cutout.

By way of example, a plurality of semiconductor components can be fitted in the cutout.

The semiconductor component is a luminescence diode comprising one or a plurality of luminescence diode chips for generating electromagnetic radiation/light. The luminescence diode chip can be a light-emitting or laser diode chip that emits radiation in the range from ultraviolet to infrared light. Preferably, the luminescence diode chip emits light in the visible range of the spectrum of the electromagnetic radiation. The luminescence diode chip can be a semiconductor chip. The semiconductor chip has an epitaxially grown semiconductor layer sequence having an active zone suitable for generating radiation.

An optical axis of the semiconductor component is perpendicular to the epitaxially grown semiconductor layer sequence of the semiconductor chip.

Furthermore, the semiconductor component has an optical element. The optical element is disposed downstream of the semiconductor chip and influences the electromagnetic radiation emitted by the semiconductor chip during operation.

At least part of the electromagnetic radiation emitted by the semiconductor component during operation is directed onto the reflector by the optical element. The electromagnetic radiation emitted by the semiconductor component is refracted and/or reflected for example at a radiation coupling-out area of the optical element and coupled out from the semiconductor component in such a way that at least part of the electromagnetic radiation is incident on the reflector and reflected by the latter. A further part of the radiation is coupled out from the semiconductor component through the optical element in such a way that it can be coupled out from the illumination device directly, without prior deflection onto the reflector. By way of example, the radiation coupling-out area of the optical element is that surface of the optical element which faces away from the semiconductor chip.

In accordance with at least one embodiment, the illumination device has a radiation exit area which is at least twice as large as the sum of the radiation exit areas of the semiconductor components.

The area content of the radiation exit area of the illumination device is the content of the area defined by the projection of the opening of the cutout in the basic body onto a plane perpendicular to the optical axis of the semiconductor component. In this case, "projection" means the mathematical mapping of the opening of the cutout onto the plane running perpendicular to the optical axis of the semiconductor component. The area content of the radiation exit area of the semiconductor component is correspondingly defined as the area content of the projection of the radiation coupling-out area of the optical element onto the plane already defined. In other words, the area contents of the two radiation exit areas are determined in the projection onto a plane.

If one radiation-emitting semiconductor component is then situated in the cutout, for example, the radiation exit area of the illumination device is at least twice as large as the radiation exit area of the semiconductor component. If a plurality of semiconductor components are arranged in a cutout, then the radiation exit area of the illumination device is at least twice as large as the sum of all the individual radiation exit areas of the semiconductor components.

In accordance with at least one embodiment of the illumination device, the illumination device has a basic body having a cutout and a reflector, which is formed at least by parts of the cutout. Furthermore, the illumination device has at least one optoelectronic semiconductor component arranged in the cutout. The semiconductor component furthermore has an optical element designed for directing at least part of the electromagnetic radiation emitted by the semiconductor component during operation onto the reflector. The radiation exit area of the illumination device is at least twice as large as the sum of the radiation exit areas of the semiconductor components.

In this case, the illumination device described here is based on the insight, inter alia, that an intensified glare effect can occur for an external observer of a semiconductor component as a result of a high luminance of the radiation-emitting semiconductor component.

The luminance is in this case a measure of the brightness and is defined by light intensity per area.

Furthermore, the radiation exit area only of the semiconductor component is relatively small for an external observer. In this respect, a combination of the high luminance of the semiconductor component together with the small radiation exit area of the semiconductor component produces a disturbing and irritating luminous impression for an external observer, such that a glare effect can occur for an external observer.

In order, then, to avoid the glare effect caused by the high luminance of the semiconductor component for an external observer, the illumination device described here makes use of the concept of combining a reflector with a radiation-emitting semiconductor component. For this purpose, the optoelectronic semiconductor component is fitted in a cutout that forms the reflector at least in places. The problem of the high luminance and the small radiation exit area and the glare effect associated therewith for an external observer is solved, then, by virtue of the fact that the emitted electromagnetic radiation is at least partly deflected onto the reflector by the optical element having the semiconductor component. The reflector reflects the electromagnetic radiation impinging on it. The total electromagnetic radiation coupled out from the illumination device is therefore composed of electromagnetic radiation deflected onto the reflector by the optical element, and the radiation portion that is coupled out from the component directly by means of the optical element, without being incident on the reflector beforehand. This leads to an expansion of the radiation exit area discernible to an external observer, which can be formed by the entire inner area of the reflector in a plan view of the illumination device. Advantageously, the light intensity of the semiconductor component is thus distributed over the radiation exit area of the illumination device. This has the consequence of avoiding glare effects for an external observer of the radiation exit area of the illumination device. That is to say that, in a plan view of the component, electromagnetic radiation is emitted at least from the regions at which the reflector is situated, if appropriate also from regions at which the semiconductor component is situated.

In accordance with at least one embodiment of the illumination device, the basic body of the illumination device has at least two cutouts. That is to say that the basic body can have a plurality of cutouts, wherein a semiconductor component is fitted in each cutout. It is likewise possible for a plurality of semiconductor components to be arranged in one cutout. Advantageously, a highest possible light intensity of the illumination device is ensured by the arrangement of a multiplicity of optoelectronic semiconductor components in one cutout.

In accordance with at least one embodiment of the illumination device, the luminance of a partial area of the radiation exit area of the illumination device deviates by less than 20%, preferably less than 10%, especially preferably less than 5%, from the average value of the luminance of the total radiation exit area of the illumination device. The radiation exit area of the illumination device can be divided into arbitrary partial areas. The sum of all the partial areas in turn produces the total radiation exit area of the illumination device. If an arbitrary partial area of the radiation exit area of the illumination device is observed, then the luminance of this partial area deviates by less than 20% from the average value of the luminance of the illumination device. Advantageously, the radiation exit area of the illumination device thus appears uniform in its brightness. By virtue of the fact that the optical element directs part of the radiation onto the reflector, glare effects for an external observer are simultaneously avoided.

In accordance with at least one embodiment of the illumination device, the cutout has a maximum diameter of at least 5 cm, preferably at least 7 cm, especially preferably at least 10 cm, at the outer area of the basic body. The total light intensity of the semiconductor component is distributed over the radiation exit area of the illumination device. By way of example, the radiation exit area of the illumination component is circular, oval or rectangular. This can be achieved, for example, by the opening of the cutout itself being embodied in circular fashion. Advantageously, by virtue of a diameter chosen in this way, the radiation exit area is chosen to be as large as possible, such ,hat the total light intensity is distributed over the radiation exit area of the illumination device and the radiation exit area of the illumination component is thus increased. A radiation exit area constituted in this way leads to an illumination device which is especially suitable for illuminating large-area objects, for example. Furthermore, it is advantageously possible, by means of the choice of the diameter and thus the size of the radiation exit area, to set the luminance of the radiation exit area of the illumination device and additionally to adapt the area of the radiation exit area of the illumination component individually to the requirements of the user.

In accordance with at least one embodiment of the illumination device, the distance from the radiation exit area of the illumination device as far as the deepest point of the cutout is at least 2 mm greater than the maximum height of the optoelectronic component. The deepest point of the cutout is that point which is at the furthest distance from the opening of the cutout parallel to the optical axis of the semiconductor component. The maximum height of the optoelectronic component is, for example, that path which runs parallel to the optical axis of the semiconductor component and encompasses the maximum extent of the optoelectronic semiconductor component along this direction. If the optoelectronic component is then fitted at the deepest point of the cutout, the distance between the radiation exit area of the illumination device and the semiconductor component arranged below the radiation exit area of the illumination device is at least 2 mm.

In accordance with at least one embodiment, the optoelectronic semiconductor component projects above the cutout. That can mean that the maximum height of the optoelectronic semiconductor component is greater than the path, parallel to the optical axis of the semiconductor component, from the deepest point of the cutout as far as the opening of the cutout.

In accordance with at least one embodiment of the illumination device, the reflector has at least one reflector wall. The reflector wall can be formed by a side area of the cutout. The reflector wall surrounds the semiconductor component laterally at least in places. The reflector wall is formed, at least in places, in the manner of at least one of the basic optical elements CPC (Compound Parabolic Concentrator), CEC (Compound Elliptic Concentrator), CHC (Compound Hyperbolic Concentrator). Preferably, the reflector wall forms a "freeform area". In this context, "freeform area" denotes an area that is individually adapted to the respective illumination requirements of the illumination device.

In accordance with at least one embodiment of the illumination device, the optical element is designed for deflecting at least part of the electromagnetic radiation emitted during the operation of the semiconductor component at an angle of at least 110° with respect to the optical axis of the semiconductor component.

Part of the electromagnetic radiation emitted by the semiconductor component is coupled out from the semiconductor component through the optical element in such a way that the part of the radiation subsequently emerges directly from the illumination device, without being deflected onto the reflector beforehand. This radiation portion forms the radiation portion that is coupled out directly. A further part of the total radiation is coupled out through a radiation exit area of the optical element in such a way that the angle between the optical axis of the semiconductor component and the radiation coupled out by the optical element is at least 110°. The radiation portion coupled out from the semiconductor component in this way at such an angle is therefore deflected "toward the rear", away from the optical element and the radiation exit area of the illumination device. Preferably, the radiation portion is deflected onto the reflector wall of the reflector and subsequently reflected by the reflector wall in order then to be able to be coupled out from the illumination device.

In accordance with at least one embodiment, the deflection of the electromagnetic radiation is effected at least partly by total reflection. At least part of the deflection of the radiation into the reflector is effected by total reflection at the radiation coupling-out area of the optical element. This is possible, in particular, when the refractive index of the optical element is greater than the refractive index of the medium surrounding the optical element. The medium can be air, for example. The electromagnetic radiation can therefore be directed onto the reflector wall of the reflector by total reflection at the radiation coupling-out area of the optical element.

In accordance with at least one embodiment, the deflection of the electromagnetic radiation is effected at least partly by refraction. At least part of the deflection of the radiation into the reflector is effected by refraction at the radiation coupling-out area of the optical element. That is to say that, besides the optical influencing by total reflection, the electromagnetic radiation can also be deflected into the reflector by means of refraction. Advantageously, a largest possible portion of the total electromagnetic radiation emitted by the semiconductor component is thus directed onto the surface of the reflector wall, as a result of which the abovementioned effects with regard to reduced glare effect and larger luminous area are intensified.

In accordance with at least one embodiment, a covering plate that is radiation-transmissive to electromagnetic radiation covers the cutout. The covering plate is a radiation-transmissive, rigid body, which can terminate flush with the outer area of the basic body and is in direct contact with the basic body. Preferably, the covering plate is constituted such that it is self-supporting. The covering plate can be embodied in transparent fashion. It is also possible for the covering plate to be embodied in milky fashion and to diffusely scatter electromagnetic radiation passing through. It is likewise conceivable for optical elements to be introduced into the covering plate, or for the covering plate itself to form an optical element. Furthermore, further optical elements can be disposed downstream of the covering plate. The optical elements can be microprisms or optical filters.

In accordance with at least one embodiment, the covering plate terminates flush with the outer area of the basic body. Preferably, the covering plate is shaped in such a way that it fits into the cutout and that surface of the covering plate which faces away from the semiconductor component thus terminates flush with the outer area of the basic body. In this case, that surface of the covering plate which faces away from the semiconductor component forms the surface through which electromagnetic radiation is emitted. Advantageously, it is thus possible to provide an illumination device whose entire surface is embodied in planar fashion and without interruptions. Furthermore, the covering plate affords protection against external environmental influences such as, for example, harmful gases or liquids. It is likewise possible for that surface of the covering plate which faces away from the semiconductor component not to terminate flush with the outer area of the basic body. That can mean that in this case the covering plate is attached or fitted higher or deeper in the cutout.

BRIEF DESCRIPTION OF THE DRAWINGS

FIG. 1B shows, in a schematic plan view, the illumination device in accordance with FIG. 1A.

DETAILED DESCRIPTION OF THE DRAWINGS

In the exemplary embodiments and the figures, identical or identically acting constituent parts are in each case provided with the same reference symbols. The elements illustrated should not be regarded as true to scale; rather, individual elements may be illustrated with an exaggerated size in order to afford a better understanding.

Figure 1A:
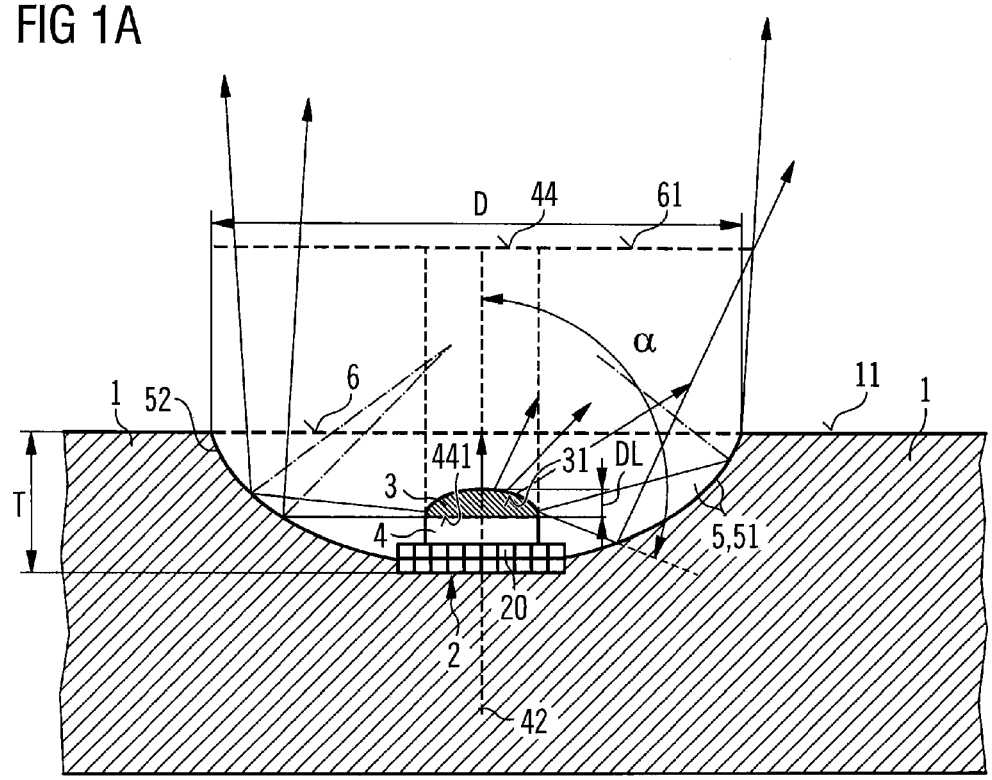
FIG. 1A shows, in a schematic sectional illustration, an exemplary embodiment of an illumination device described here.

FIG. 1A shows, on the basis of a schematic sectional illustration, an illumination device described here comprising a basic body 1 and an optoelectronic semiconductor component 20 fitted in a cutout 5. The basic body 1 is formed with a ceramic material or a metal. The cutout 5 is a depression in the basic body 1 which has an opening 6 and is freely accessible from outside.

The semiconductor component has a carrier 2 and a semiconductor chip 4.

The carrier 2 can be a printed circuit board or a leadframe. The carrier 2 is surface-mountable, for example. The carrier 2 can be formed with a thermosetting plastic material or thermoplastic material or else with a ceramic material. The semiconductor chip 4 is electrically conductively contact-connected to the carrier 2.

An outer area 11 of the basic body 1 terminates flush with the edges of the cutout 5. A radiation exit area 61 of the illumination device is the content of the area defined by the projection of the opening 6 of the cutout 5 in the basic body 1 onto a plane perpendicular to an optical axis 42 of the semiconductor component 20. In this case, "projection" means the mathematical mapping of the opening 6 of the cutout 5 onto the plane running perpendicular to the optical axis 42 of the semiconductor component 20. The optical axis 42 of the semiconductor component runs perpendicular to an epitaxially grown semiconductor layer sequence of the semiconductor chip 4.

Furthermore, the radiation exit area 61 is embodied in oval fashion and has a maximum diameter D of X mm.

The illumination device has a reflector 51. The cutout 5 forms the reflector 51. The semiconductor component 20 is fitted at the deepest point of the reflector 51.

A reflector wall 52 can be described from the three basic geometrical elements CPC, CEC and CHC or from any desired combination of such elements. This advantageously affords the possibility of individually adapting and setting the reflector 51 to the respective illumination requirements of the illumination device.

In the present exemplary embodiment, the reflector wall 52 is formed by a continuous and contiguous side area. In the embodiment illustrated in FIG. 1A, the optical axis 42 of the semiconductor component 20 simultaneously forms an axis of symmetry of the reflector 51.

The reflector wall 52 is coated with a highly reflective material, for example a metal layer composed of aluminum. This advantageously ensures that as much radiation as possible is reflected by the reflector wall 52.

In the present case, the optoelectronic semiconductor component 20 is connected to the reflector wall 52 via the carrier 2 by means of adhesive bonding at the deepest point at a depth T of the reflector 51. The depth T is the path from the reflector wall 52 along the optical axis 42 of the semiconductor component 20 as far as the opening 6 of the cutout 5.

An optical element 3, for example a lens in the form of a wide-angle lens, is applied to a radiation exit area 441 of the semiconductor chip 4. The optical element 3 refracts and/or reflects impinging electromagnetic radiation emitted by the semiconductor chip 4 away from the optical axis 42 of the semiconductor component 20. In particular, the optical element 3 has the maximum thickness DL on the optical axis 42 of the semiconductor component 20 and is 2 mm thick at this location. The material of the optical element 3 is free of radiation-scattering particles and can be formed with a polycarbonate (also referred to as PC) or with a silicone.

The optical element 3 is shaped in such a way that at least part of the electromagnetic radiation emitted by the semiconductor chip 4 is deflected at an angle a of at least 110° with respect to the optical axis 42 of the semiconductor component 20. The radiation portion coupled out from the semiconductor component in this way at such an angle a is therefore deflected "toward the rear", away from the optical element 3 and the radiation exit area 61 of the illumination device and thus impinges on the reflector wall 52 of the reflector 51 in order subsequently to be reflected there. After reflection, the radiation portion is coupled out from the illumination device.

Part of the deflection of the radiation into the reflector is effected by total reflection at a radiation coupling-out area 31 of the optical element 3. The radiation coupling-out area 31 is that surface of the optical element 3 which faces away from the semiconductor chip 4. The totally reflected radiation portion is deflected onto the reflector wall 52, reflected and then coupled out from the illumination device via the radiation exit area 61 of the illumination device.

A further radiation portion is coupled out from the semiconductor component 20 through the optical element in such a way that the radiation can be coupled out from the illumination device directly, without being deflected onto the reflector 51 beforehand.

The electromagnetic radiation coupled out from the illumination device is therefore composed at least of the radiation portion deflected from the optical element 3 toward the reflector 51 and the radiation portion coupled out from the illumination device directly, without being deflected onto the reflector 51 beforehand.

What can thus be achieved is that the radiation exit area 61 in the exemplary embodiment shown in FIG. 1A is X times larger than a radiation exit area 44 of the semiconductor component 20.

The area content of the radiation exit area 44 of the semiconductor component 20 is defined as the area content of the projection of the radiation coupling-out area 31 of the optical element 3 onto a plane perpendicular to the optical axis 42 of the semiconductor component 20.

Furthermore, it can be shown that, with such a configuration of the illumination device, the luminance fluctuations along the radiation exit area 61 are less than 5% of the average value of the luminance of the total radiation exit area 61 of the illumination device. Advantageously, the radiation exit area 61 of the illumination device thus appears particularly uniform in its light intensity.

Furthermore, the configuration of the illumination device leads to an illumination device having a small structural height since, in the direction of the optical axis 42 of the semiconductor component 20, it is possible to dispense with space-consuming downstream optical units for increasing the radiation exit area 44 of the semiconductor component 20. The structural height is the extent of the illumination device along the optical axis 42 of the semiconductor component 20. This results in a particularly flat illumination device.

FIG. 1B illustrates the illumination device in accordance with FIG. 1A in a schematic plan view. The basic body 1 has two cutouts 5 in accordance with FIG. 113. An optoelectronic semiconductor component 20 is fitted in each of the two cutouts 5.

Figure 2:
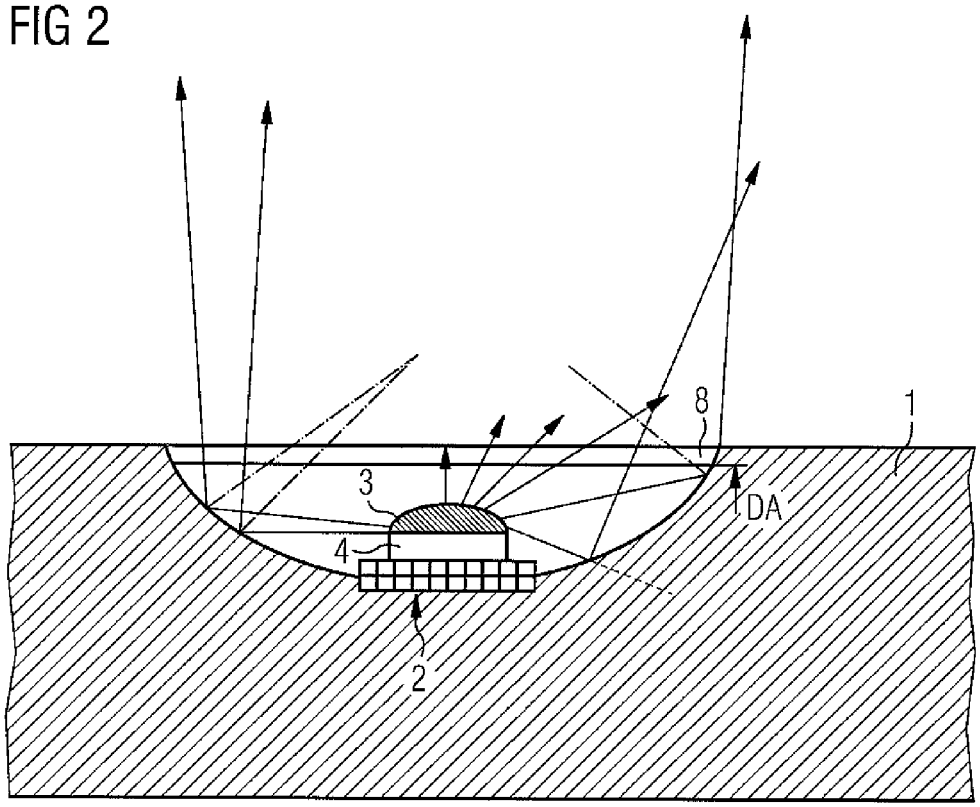
FIG. 2 shows, in a schematic sectional illustration, a further exemplary embodiment in accordance with at least one embodiment of the illumination device described here.

FIG. 2 illustrates, in a sectional illustration, a finished illumination device in accordance with at least one embodiment.

In contrast to the illumination device illustrated in FIG. 1A, the illumination device in accordance with FIG. 2 has a covering plate 8. That surface of the covering plate 8 which faces away from the optoelectronic semiconductor component 20 terminates laterally flush with the outer area 11 of the basic body 1 and has the maximum diameter D of the opening 6 of the cutout 5. In this case, that surface of the covering plate 8 which faces away from the semiconductor component 20 forms the surface 5 of the cutout. Advantageously, it is thus possible to provide an illumination device whose entire surface is embodied in planar fashion and without interruptions. Furthermore, the covering plate 8 protects the illumination device, in particular the semiconductor component 20, against external environmental influences. The covering plate 8 is a self-supporting plate. That is to say that the covering plate 8 requires no further fixing and stabilization measures after application. The covering plate 8 therefore maintains its form, such that no fracture locations, unevennesses or the like are formed in the covering plate 8. The thickness DA of the covering plate 8 is 1.5 mm in the present case. Therefore, between that surface of the covering plate 8 which faces the semiconductor component 20 and the semiconductor component 20, a distance of 0.5 mm is formed at at least one location.

The invention is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or the exemplary embodiments.

The invention claimed is:
1. An illumination device comprising:
a basic body having a cutout;
a reflector, which is formed at least by parts of the cutout;
at least one optoelectronic semiconductor component arranged in the cutout, wherein the semiconductor component has an optical element configured for directing at least part of the electromagnetic radiation emitted by the semiconductor component during operation onto the reflector,
wherein a radiation exit area of the illumination device is at least twice as large as the sum of the radiation exit areas of the semiconductor components;

wherein the semiconductor component is a luminescence diode comprising one or a plurality of luminescence diode chips for generating electromagnetic radiation light;

wherein the optical element is applied to a radiation exit area of the luminescence diode;

wherein the optical element is configured for deflecting at least part of the electromagnetic radiation emitted during the operation of the semiconductor component at an angle of at least 110° with respect to the optical axis of the semiconductor component; and wherein the deflection of the electromagnetic radiation is effected at least partly by total reflection.

2. The illumination device according to claim 1, wherein the basic body has at least two cutouts.

3. The illumination device according to claim 1, wherein the luminance of a partial area of the radiation exit area of the illumination device deviates by less than 20% from the average value of the luminance of the total radiation exit area of the illumination device.

4. The illumination device according to claim 1, wherein the cutout has a diameter of at least 5 cm at an outer area of the basic body.

5. The illumination device according to claim 1, wherein the distance from the radiation exit area of the illumination device as far as the deepest point of the cutout is at least 2 mm greater than the maximum height of the optoelectronic semiconductor component.

6. The illumination device according to claim 1, wherein a reflector wall is formed, at least in places, in the manner of at least one of the following basic optical elements: CPC, CEC, CHC.

7. The illumination device according to claim 1, wherein the deflection of the electromagnetic radiation is effected at least partly by refraction.

8. The illumination device according to claim 1, wherein a covering plate that is radiation-transmissive to electromagnetic radiation covers the cutout.

9. The illumination device according to claim 8, wherein the covering plate terminates flush with the outer area of the basic body.

* * * * *